(12) United States Patent
Chen et al.

(10) Patent No.: US 10,720,601 B2
(45) Date of Patent: Jul. 21, 2020

(54) DISPLAY DEVICE

(71) Applicant: InnoLux Corporation, Miao-Li County (TW)

(72) Inventors: Yun-Sheng Chen, Miao-Li County (TW); Kuang-Pin Chao, Miao-Li County (TW); Hsia-Ching Chu, Miao-Li County (TW); Ming-Chien Sun, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 78 days.

(21) Appl. No.: 15/886,903

(22) Filed: Feb. 2, 2018

(65) Prior Publication Data

US 2018/0254434 A1 Sep. 6, 2018

(30) Foreign Application Priority Data

Mar. 1, 2017 (CN) .......................... 2017 1 0116807

(51) Int. Cl.
| | |
|---|---|
| *H01L 51/52* | (2006.01) |
| *H01L 25/16* | (2006.01) |
| *H01L 27/32* | (2006.01) |
| *H01L 33/40* | (2010.01) |
| *H01L 33/44* | (2010.01) |

(Continued)

(52) U.S. Cl.
CPC ...... *H01L 51/5253* (2013.01); *H01L 25/0753* (2013.01); *H01L 27/3246* (2013.01); *H01L 27/3258* (2013.01); *H01L 33/405* (2013.01); *H01L 33/42* (2013.01); *H01L 33/44* (2013.01); *H01L 33/52* (2013.01); *H01L 33/62* (2013.01); *H01L 51/5218* (2013.01); *H01L 51/5234* (2013.01); *H01L 51/5246* (2013.01); *H01L 51/56* (2013.01); *H01L 25/167* (2013.01); *H01L 33/58* (2013.01); *H01L 51/5281* (2013.01); *H01L 2251/5338* (2013.01); *H01L 2933/0025* (2013.01)

(58) Field of Classification Search
CPC ............... H01L 25/167; H01L 27/3244; H01L 27/3246; H01L 33/52; H01L 33/54; H01L 33/58; H01L 51/5246; H01L 51/525; H01L 51/5253; H01L 51/5237; H01L 51/56; H01L 2251/5338; H01L 2933/0025
See application file for complete search history.

(56) References Cited

U.S. PATENT DOCUMENTS

| | | | | |
|---|---|---|---|---|
| 2003/0140982 | A1* | 7/2003 | Seki | ........................ B41J 25/003 141/1 |
| 2016/0064461 | A1* | 3/2016 | Lee | ...................... H01L 27/3246 257/40 |
| 2018/0240852 | A1* | 8/2018 | Chen | ........................ H01L 51/50 |

FOREIGN PATENT DOCUMENTS

| | | |
|---|---|---|
| CN | 105390523 A | 3/2016 |
| CN | 105445969 A | 3/2016 |

* cited by examiner

*Primary Examiner* — David C Spalla
(74) *Attorney, Agent, or Firm* — Bacon & Thomas, PLLC

(57) ABSTRACT

A display device is disclosed, which includes: a substrate having a first edge, wherein the first edge is parallel to a first direction, and the substrate has a display region and a border region adjacent to the display region; a first insulating layer disposed on the substrate; a first electrode layer disposed on the first insulating layer; and a second insulting layer disposed on the first electrode layer, wherein the second insulating layer comprises plural protrusions, the protrusions are disposed in the border region, and the protrusions are arranged along the first direction.

18 Claims, 8 Drawing Sheets

(51) Int. Cl.
*H01L 33/52* (2010.01)
*H01L 33/62* (2010.01)
*H01L 51/56* (2006.01)
*H01L 33/42* (2010.01)
*H01L 25/075* (2006.01)
*H01L 33/58* (2010.01)

DISPLAY DEVICE

CROSS REFERENCE TO RELATED APPLICATION

This application claims the benefits of the Chinese Patent Application Serial Number 201710116807.5, filed on Mar. 1, 2017, the subject matter of which is incorporated herein by reference.

BACKGROUND

1. Field

The present disclosure relates to a display device and, more particularly, to a display device having improved reliability.

2. Description of Related Art

With the continuous advancement of technologies related to displays, all the display devices are now developed toward compactness, thinness, and lightness. This trend makes thin displays, such as liquid crystal display devices, organic light-emitting diode display devices and inorganic light-emitting diode display devices, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

The organic light-emitting diode (OLED) display devices have advantages of: light weight, thin thickness, high brightness, fast response, large viewing angle, no need for backlight, low manufacturing cost and flexibility, and is considered as a next-generation display device. However, the OLED display devices have disadvantages of poor moisture and oxygen resistance.

In addition, among the developed display devices, during the process for forming layers, the excessive accumulation of the stress inside the display device may cause the defects of the layers. Especially, when the display device is a flexible display device, the deformations of the layers may further be increased, resulting in the peeling probability between the layers increased.

Therefore, it is desirable to develop a display device, wherein the moisture and water resistance thereof can be improved, or the adhesion between layers can be improved to solve the peeling problem of the layers caused by the internal stress or the stress caused by bending of the display device, to further increase the yield of the display device.

SUMMARY

The display device of the present disclosure comprises: a substrate having a first edge, wherein the first edge is parallel to a first direction, and the substrate has a display region and a border region adjacent to the display region; a first insulating layer disposed on the substrate; a first electrode layer disposed on the first insulating layer; and a second insulating layer disposed on the first electrode layer, wherein the second insulating layer comprises plural protrusions, the protrusions are disposed in the border region, and the protrusions are arranged along the first direction.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

In addition, the features in different embodiments of the present disclosure can be mixed to form another embodiment.

Figure 1:
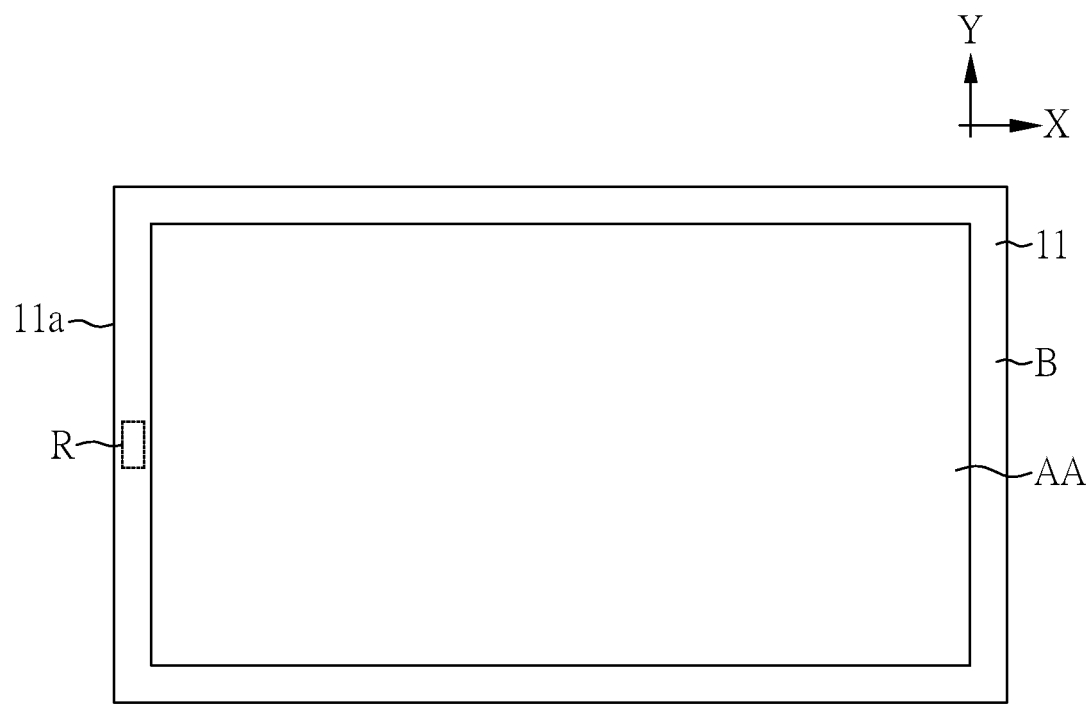
FIG. 1 is a top view of a display device according to one embodiment of the present disclosure.
Figure 2:
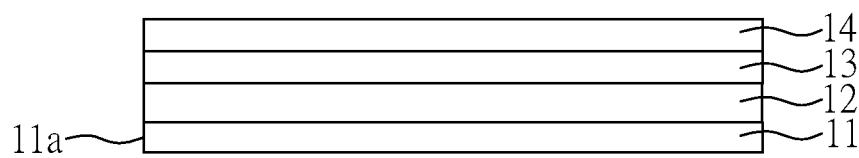
FIG. 2 is a cross-sectional view of a display device according to one embodiment of the present disclosure.
Figure 3:
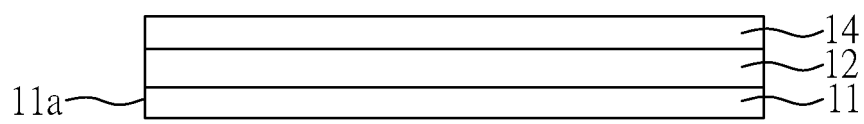
FIG. 3 is a cross-sectional view of a display device according to another embodiment of the present disclosure.

FIG. 1 and FIG. 2 are respectively a top view and a cross-sectional view of a display device according to one embodiment of the present disclosure. The display device of the pre present embodiment comprises: a substrate 11; a counter substrate 13 opposite to the substrate 11; and a display layer 12 disposed between the substrate 11 and the counter substrate 13. In addition, a protection substrate 14 may be further disposed on the counter substrate 13, and the protection substrate 14 can be a protection glass substrate or a polarizer. Furthermore, in the present embodiment, the display layer 12 can be an organic light emitting layer or an inorganic light emitting diode layer. It will be understood that an inorganic light emitting diode can be an LED, a mini LED, or a micro LED. The chip size of the LED is 300 μm to 10 mm, the mini LED is 100 μm to 300 μm, and the micro LED is 1 μm to 100 μm. But the present disclosure is not limited thereto. Other elements suitable for the display device may be respectively disposed on the substrate 11 and the counter substrate 13. For example, transistors, electrodes, and so on can be disposed on the substrate 11; and color filter units, a black matrix layer and so on can be disposed on the counter substrate 13. However, the present disclosure is not limited thereto. The aforesaid elements and/or other elements can be selectively disposed on the substrate 11 and/or the counter substrate 13 if it is necessary In the present embodiment, the substrate 11 and/or the counter substrate 13 can be a glass substrate, a sapphire substrate, a silicon substrate, a plastic substrate, other flexible substrates, or films. When the substrate 11 and/or the counter substrate 13 is plastic substrates, other flexible substrates, or films, the display device of the present embodiment can be a flexible display device. When the display device of the present embodiment is a flexible display device, the display device may not be equipped with the counter substrate 13, as shown in FIG. 3. In addition, in the flexible display device, when the display layer 12 is an organic light emitting layer, a flexible organic light emitting diode (OLED) display device can be obtained. When the display layer 12 is an inorganic light emitting diode layer, a flexible micro-light emitting diode (micro-LED) display device can be obtained.

Figure 4:
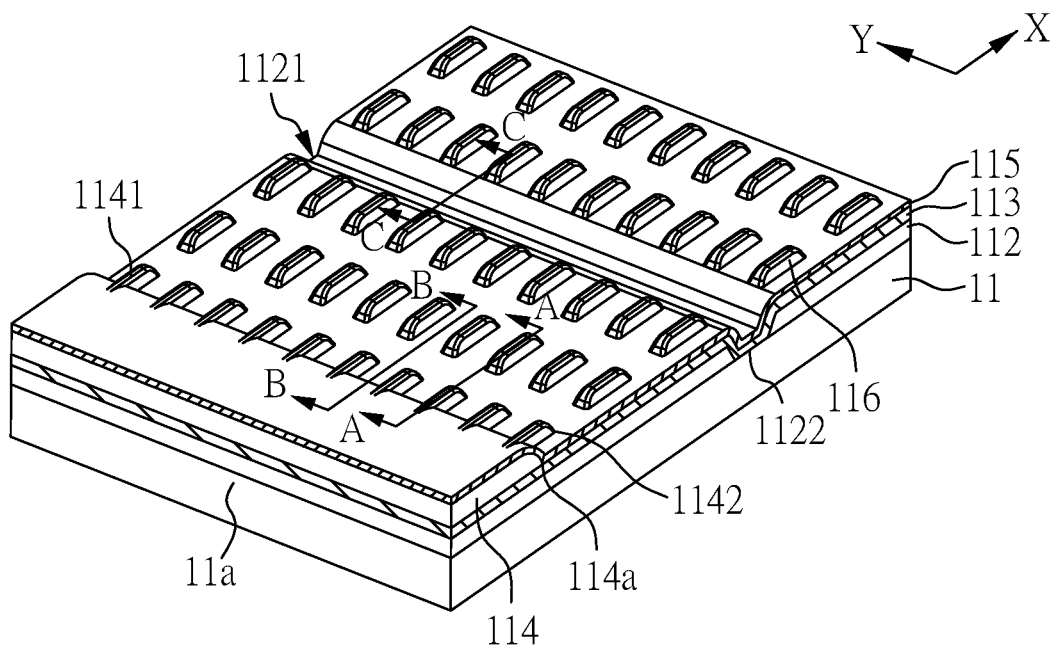
FIG. 4 is a three-dimensional view showing a part of a border region of a display device according to one embodiment of the present disclosure.
Figure 5:
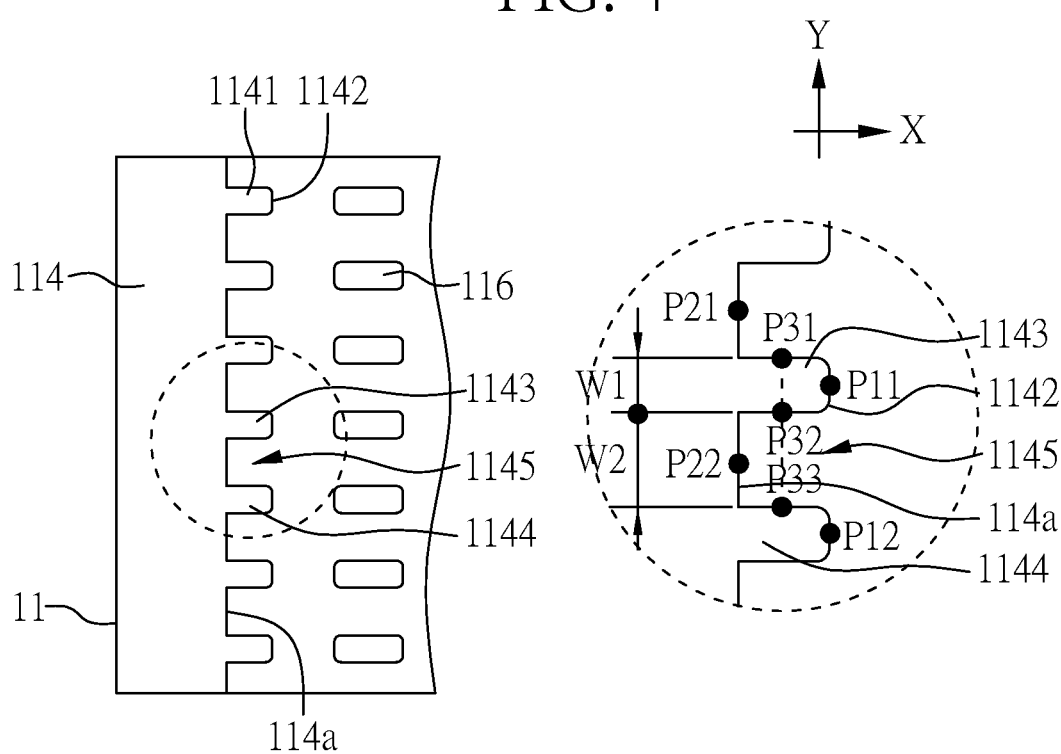
FIG. 5 is a top view showing a part of a border region of a display device according to one embodiment of the present disclosure.
Figure 6A:
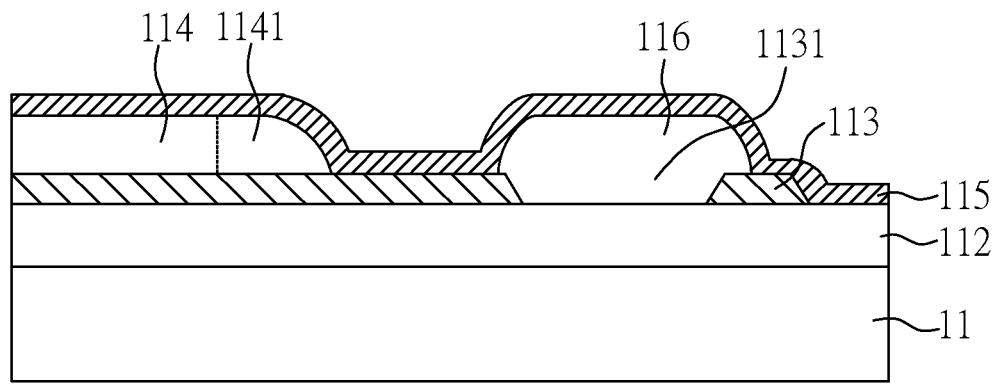
FIG. 6A is a cross-sectional view along the line A-A indicated in FIG. 4.
Figure 6B:
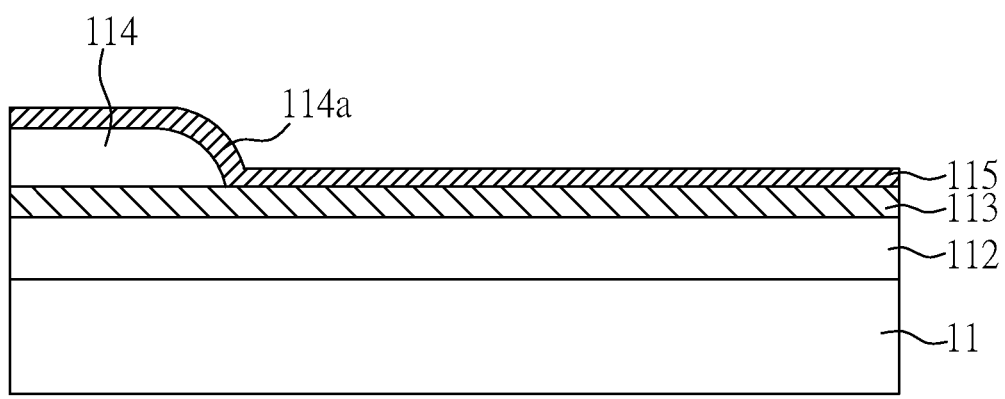
FIG. 6B is a cross-sectional view along the line B-B indicated in FIG. 4.
Figure 6C:
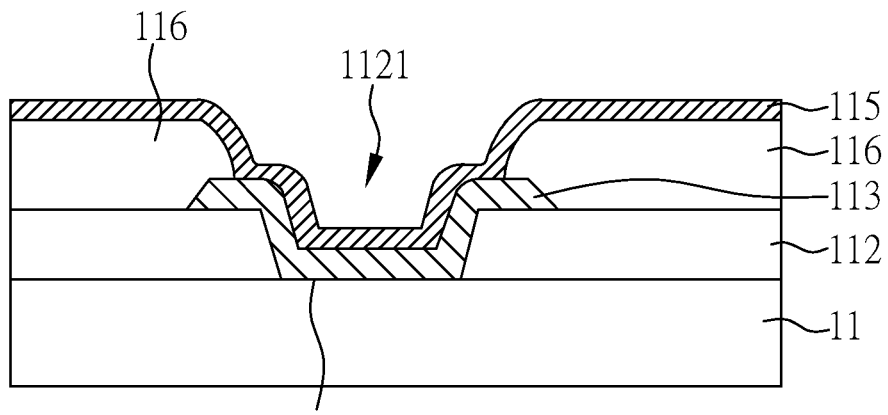
FIG. 6C is a cross-sectional view along the line C-C indicated in FIG. 4.

FIG. 4 and FIG. 5 are respectively a three-dimensional view and a top view showing a part of a border region B (i.e. the region R indicated in FIG. 1) of a display device according to one embodiment of the present disclosure, wherein FIG. 5 is a top view showing a part of the region show in FIG. 4. FIG. 6A to FIG. 6C are cross-sectional views respectively along the line A-A, the line B-B and the line C-C indicated in FIG. 4. As shown in FIG. 1, FIG. 4, FIG. 6A and FIG. 6B, the display device of the present embodiment comprises: a substrate 11 having a first edge 11a, wherein the first edge 11a is parallel to a first direction Y, and the substrate 11 has a display region AA and a border region B adjacent to the display region AA; a first insulating layer 112 disposed on the substrate 11; a first electrode layer 113 disposed on the first insulating layer 112; and a second insulating layer 114 disposed on the first electrode layer 113.

Herein, the first insulating layer 112 can be a planar layer, and the second insulating layer 114 can be a pixel defining layer. The first insulating layer 112 and the second insulating layer 114 can respectively be, for example, an organic layer, an oxide layer (such as a silicon oxide layer), a nitride layer (such as a silicon nitride layer), a oxynitride layer (such as a silicon oxynitride layer), or a combination thereof; but the present disclosure is not limited thereto. In addition, the first electrode layer 113 can be a reflective electrode or a transparent electrode. In the present embodiment, the first electrode layer 113 is a reflective electrode, which can be a single metal layer or multi-metal layers, wherein the metal can be Ag, Ge, Al, Cu, Mo, Ti, Sn, AlNd, ACX (Al alloy) or APC (Ag alloy). However, the present disclosure is not limited thereto.

As shown in FIG. 4, FIG. 5, FIG. 6A and FIG. 6B, in the display device of the present embodiment, during the process for forming the second insulating layer 114, the second insulating layer 114 is patterned through a photolithography process to form plural protrusions 1141. Hence, in the display device of the present embodiment, the second insulating layer 114 comprises plural protrusions 1141, the protrusions 1141 are disposed in the border region B, and the protrusions 1141 are arranged along the first direction Y. As shown in FIG. 4 and FIG. 5, in the present embodiment, the protrusions 1141 are arranged in a comb shape along the first direction Y. In addition, edges of the second insulating layer 114 can form a wavy edge, wherein the wavy edge comprises plural linear segments 114a and plural curve segments 1142, and the linear segments 114a and the curve segments 1142 are alternately arranged. In the present embodiment, the linear segments 114a are parallel to the first direction Y, wherein "the linear segments 114a are parallel to the first direction Y" includes: the linear segments 114a are completely parallel to the first direction Y, or an angle of 0 degree to ±5 degrees is included between the linear segments 114a and the first direction Y. However, the present disclosure is not limited thereto. The linear segments 114a may not be parallel to the first direction Y, as long as the wavy edge is formed.

As shown in FIG. 4 and FIG. 5, when the second insulating layer 114 as the pixel defining layer comprises protrusions 1141 in the border region B and the protrusions 1141 are disposed at one side of the second insulating layer 114, the side of the second insulating layer 114 has a wavy edge (including the edges of the protrusions 1141). That is, the second insulating layer 114 is not continuously disposed from the border region B to the display region AA. In other words, an occupied region of the second insulating layer 114 is extending from the first edge 11a to the wavy edge. Hence, the penetration path of moisture and oxygen can be blocked; and more specifically, the penetration path of moisture and oxygen to the display region AA along the second insulating layer 114 can be blocked. Therefore, the purpose of blocking moisture and oxygen can be achieved. And the reliability of the display device can be improved.

In addition, when the second insulating layer 114 as the pixel defining layer comprises protrusions 1141, the protrusions 1141 can improve the adhesion between the second insulating layer 114 and the layers on the second insulating layer 114. More specifically, when the display device is a flexible display device, the substrate 11 is a flexible substrate, and the peeling between layers may be easily occurred during the encapsulating process. Hence, in the display device of the present embodiment, the disposition of the protrusions 1141 of the second insulating layer 114 can enhance the adhesion between the second insulating layer 114 and the layers on the second insulating layer 114; therefore, the peeling between the second insulating layer 114 and the layers on the second insulating layer 114 can be prevented, and the overall yield of the display device can further be increased.

Furthermore, heat may be generated during the process for preparing the display device, the generated heat may cause thermal expansion or shrinkage of the second insulating layer 114, and the stress generated by the thermal expansion or shrinkage may cause the second insulating layer 114 cracked. Hence, in the display device of the present embodiment, the dispositions of the protrusions 1141 of the second insulating layer 114 can share the stress generated by the thermal expansion or shrinkage; therefore, the crack generation in the second insulating layer 114 can be prevented, and the overall yield of the display device can further be increased.

Figure 7:
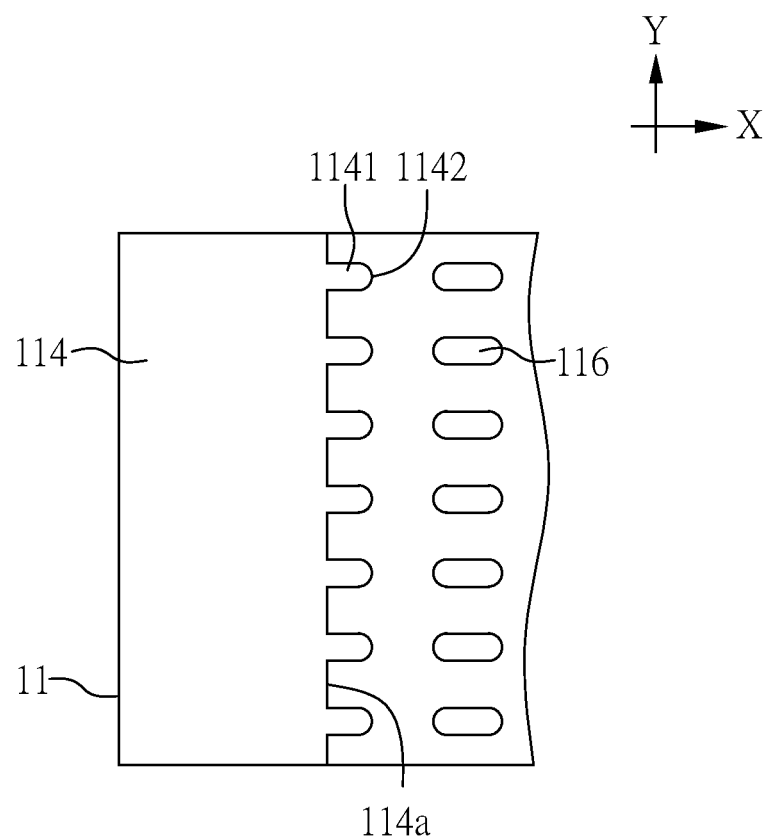
FIG. 7 is a top view showing a part of a border region of a display device according to another embodiment of the present disclosure.

As shown in FIG. 5, in the display device of the present embodiment, edges of the second insulating layer 114 can form a wavy edge, wherein the wavy edge comprises plural linear segments 114a and plural curve segments 1142. Herein, the curve segments 1142 can be the curve segment with an approximate rectangle shape shown in FIG. 5, or can be the curve segment with a curve shape shown in FIG. 7. In addition, in other embodiments of the present disclosure, the protrusions 1141 can have curve segments 1142 respectively having an approximate rectangle shape shown in FIG. 5 or an curve shape shown in FIG. 7; therefore, the display device may comprises the protrusions 1141 with curve segments 1142 having approximate rectangle shapes and with curve segments 1142 having curve shapes at the same time. Herein, the so-called curve segment having an approximate rectangle shape or a curve shape means the shape observed from a top view of the display device. In other word, the so-called curve segment having an approximate rectangle shape or a curve shape refers to the shape of the orthographic projection obtained when the protrusion 114 is projected on the substrate 11.

Figure 8:
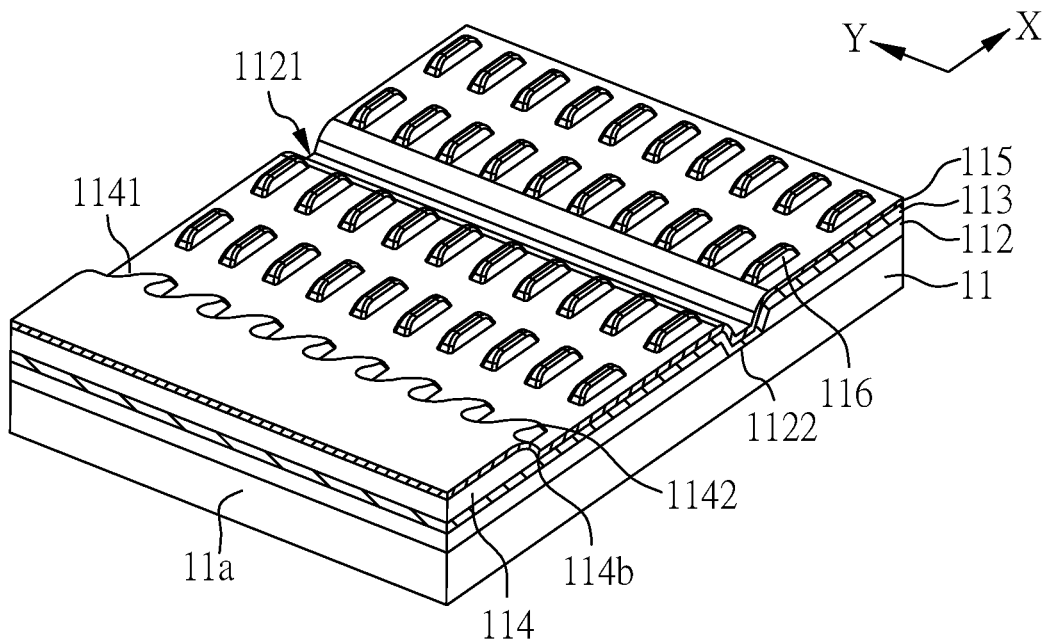
FIG. 8 is a three-dimensional view showing a part of a border region of a display device according to another embodiment of the present disclosure.
Figure 9:
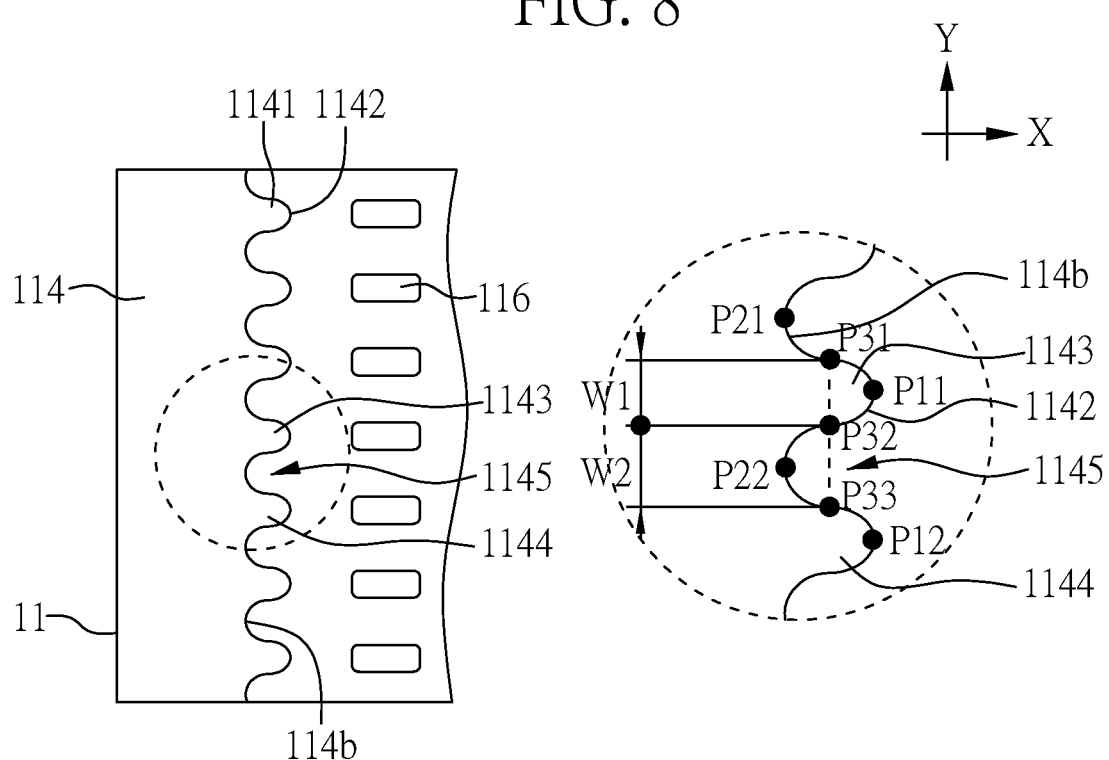
FIG. 9 is a top view showing a part of a border region of a display device according to another embodiment of the present disclosure.

FIG. 8 and FIG. 9 are respectively a three-dimensional view and a top view showing a part of a border region (i.e. the region R indicated in FIG. 1) of a display device according to another embodiment of the present disclosure, wherein FIG. 9 is a top view showing a part of the region show in FIG. 8. The structure of the part of the border region shown in FIG. 8 and FIG. 9 is similar to the structure shown in FIG. 4 and FIG. 5, except the wavy edge formed by the edges of the second insulating layer 114. In the structure shown in FIG. 8 and FIG. 9, the linear segments 114a shown in FIG. 4 and FIG. 5 are substituted with curve segments 114b shown in FIG. 8 and FIG. 9. Herein, the so-called linear or curve segment means the shape observed from a top view of the display device. In other word, the linear segment 114a or the curve segment 114b refers to the shape of the orthographic projection obtained when the protrusion 114 is projected on the substrate 11.

As shown in FIG. 4 and FIG. 6C, in the display device of the present embodiment, the first insulating layer 112 has a trench 1121, which is disposed in the border region B. Herein, the trench 1121 has a bottom 1122. When the first insulating layer 112 located in the border region B has the trench 1121, the first insulating layer 112 is discontinuous and disconnected at the trench 1121 in the border region. B. Hence, the penetration path of moisture and oxygen can be blocked; and more specifically, the penetration path of moisture and oxygen to the display region AA along the first insulating layer 112 can be blocked. Therefore, the purpose of blocking moisture and oxygen can be achieved. More specifically, when the display device is an OLED display device, the trench 1121 can prevent the organic materials in the display region from deteriorating by the moisture and oxygen, or the decreased light emitting efficiency of the OLED display device can be prevented.

In FIG. 4 and FIG. 6C, the trench 1121 is a linear trench and extended along the first direction Y. However, the present disclosure is not limited thereto. The trench 1121 can be a trench with other shapes, for example, a trench with a jagged shape, a stepped shape or other shapes. As long as the trench 1121 is disposed in the border region B and the first insulating layer 112 is disconnected and discontinuous at the trench 1121, the aforesaid purpose of blocking moisture and oxygen can be achieved.

As shown in FIG. 4 and FIG. 6C, the display device of the present embodiment may further comprise a second electrode layer 115 disposed on the second insulating layer 114, wherein a portion of the second electrode layer 115 overlaps the bottom 1122 of the trench 1121. In the present embodiment, the portion of the second electrode layer 115 is completely overlaps the bottom 1122 of the trench 1121, but the present disclosure is not limited thereto. In addition, the second insulating layer 114 is not disposed in the trench 1121. In the present embodiment, the second electrode layer 115 can be a transparent electrode, a semi-transparent electrode, or a composite electrode. The transparent electrode can be a transparent conductive oxide (TCO) electrode, such as an ITO electrode, an IZO electrode or an ITZO electrode. The semi-transparent electrode can be a metal thin film electrode, such as an Mg/Ag alloy thin film electrode, an Au thin film electrode, a Pt thin film electrode or an Al thin film electrode. The composite electrode can comprise the transparent electrode and the semi-transparent electrode, and an example of the composite electrode can be a composite electrode comprising a TCO electrode and a Pt thin film electrode.

As shown in FIG. 5, in the display device of the present embodiment, the protrusions 1141 comprises a first protrusion 1143 and a second protrusion 1144, the first protrusion 1143 has a first width W1 in the first direction Y, a gap 1145 between the first protrusion 1143 and the second protrusion 1144 has a second with W2 in the first direction Y, and the first width W1 is different from the second width W2. More specifically, when the edge of the second insulating layer 114 comprises plural linear segments 114a and plural curve segments 1142, the curve segments 1142 have top points P11, P12, the linear segments 114a have lowest points P21, P22 (herein, the intermediate points), a center line (indicated by the dash line) is between the top points P11, P12 and the lowest points P21, P22, and middle points P31, P32, P33 are formed at the intersections of the center line and the curve segments 1142. Herein, a distance between the middle point P31 and the middle point P32 at two sides of the curve segment 1142 along the first direction Y is defined as a first width W1, a distance between the middle point P32 and the middle point P33 located at two sides of the linear segment 114a along the first direction Y is defined as a second width W2, and the first width W1 is different from the second width W2. In the present embodiment, the first width W1 is less than the second width W2. But the present disclosure is not limited thereto.

In another embodiment of the present disclosure, as shown in FIG. 9, when the edge of the second insulating layer 114 comprises plural curve segments 114b and plural curve segments 1142, the curve segments 1142 have top points P11, P12 (peak), the curve segments 114b have lowest points P21, P22 (valley), a center line (indicated by the dash line) is between the top points P11, P12 and the lowest points P21, P22, and middle points P31, P32, P33 are formed at the intersections of the center line and the curve segments 1142 or the curve segments 114b. Herein, a distance between the middle point P31 and the middle point P32 at two sides of the curve segment 1142 along the first direction Y is defined as a first width W1, a distance between the middle point P32 and the middle point P33 located at two sides of the curve segment 114b along the first direction Y is defined as a second width. W2, and the first width W1 is different from the second width W2. In the present embodiment, the first width W1 is less than the second width W2. But the present disclosure is not limited thereto.

In addition, as shown in FIG. 4 and FIG. 6A, the display device of the present embodiment may further comprise at least one bump 116 disposed on the first insulating layer 112 and in the border region B. In the present embodiment, the bumps 116, the second insulating layer 114 and the protrusions 1141 (including the first protrusion 1143 and the second protrusion 1144) are formed by the same process, so the bumps 116, the second insulating layer 114 and the protrusions 1141 (including the first protrusion 1143 and the second protrusion 1144) comprise a same material. In addition, as shown in. FIG. 6A, the first electrode layer 113 comprises at least one hole 1131 overlapping the at least one bump 116 in a normal direction of a surface of the substrate 11. The term "overlap" can refer to partially or completely overlap.

In the display device of the present disclosure, the disposition of the bumps 116 can further improve the adhesion of the region with the bumps 116 formed thereon and layers on this region. Hence, the peeling between the region with the bumps 116 formed thereon and layers on this region can be prevented, and the overall yield of the display device can further be increased.

Figure 10:
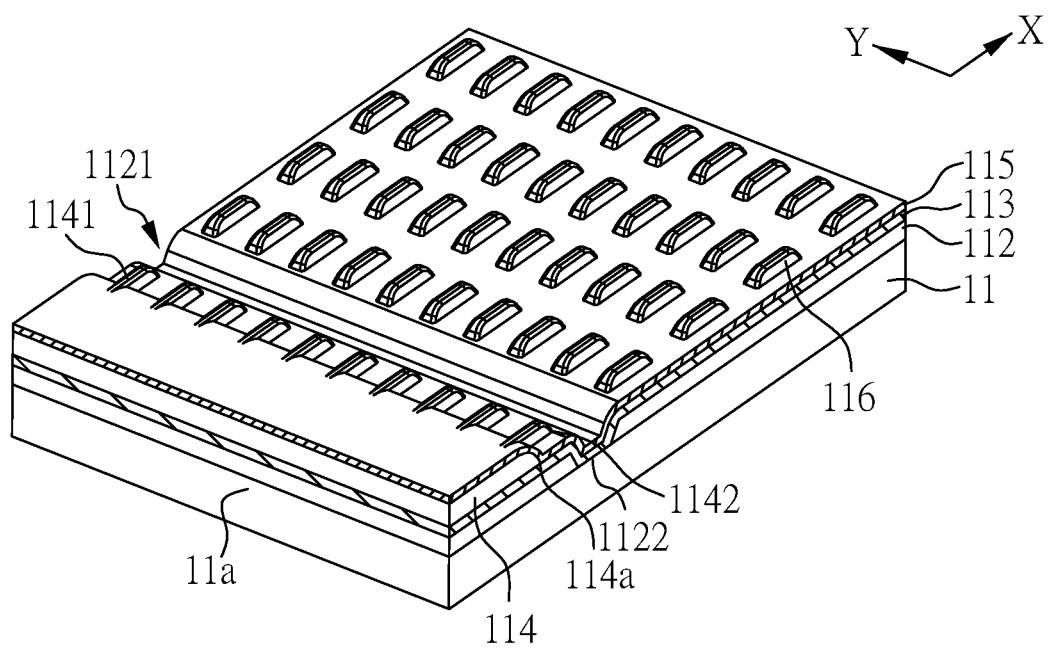
FIG. 10 is a three-dimensional view showing a part of a border region of a display device according to another embodiment of the present disclosure.

As shown in. FIG. 4, in the display device of the present disclosure, the trench 1121 of the first insulating layer 112 may be disposed between two adjacent bumps 116. However, in other embodiments of the present disclosure, the position of the trench 1121 is not particularly limited. For example, in another embodiment of the present disclosure shown in FIG. 10, the trench 1121 of the first insulating layer 112 is disposed between the bumps 116 and the protrusions 1141.

In addition, a part of the bumps 116 are disposed adjacent to the protrusions 1141 (including the first protrusion 1143 and the second protrusion 1144). For example, at least one bump 116 is adjacent to the first protrusion 1143. In addition, the plural bumps 116 can be arranged along the first direction. Y and a second direction X perpendicular to the first direction Y in a two dimensional array. Furthermore, at least one bump 116 may correspond to the protrusion 1141 (including the first protrusion 1143 or the second protrusion 1144). For example, the bump 116 may be disposed at a protruding direction of the protrusion 1141 (including the first protrusion 1143 or the second protrusion 1144). In the present embodiment, the protruding direction of the protrusion 1141 is the second direction X perpendicular to the first direction Y, but the present disclosure is not limited thereto.

Figure 11:
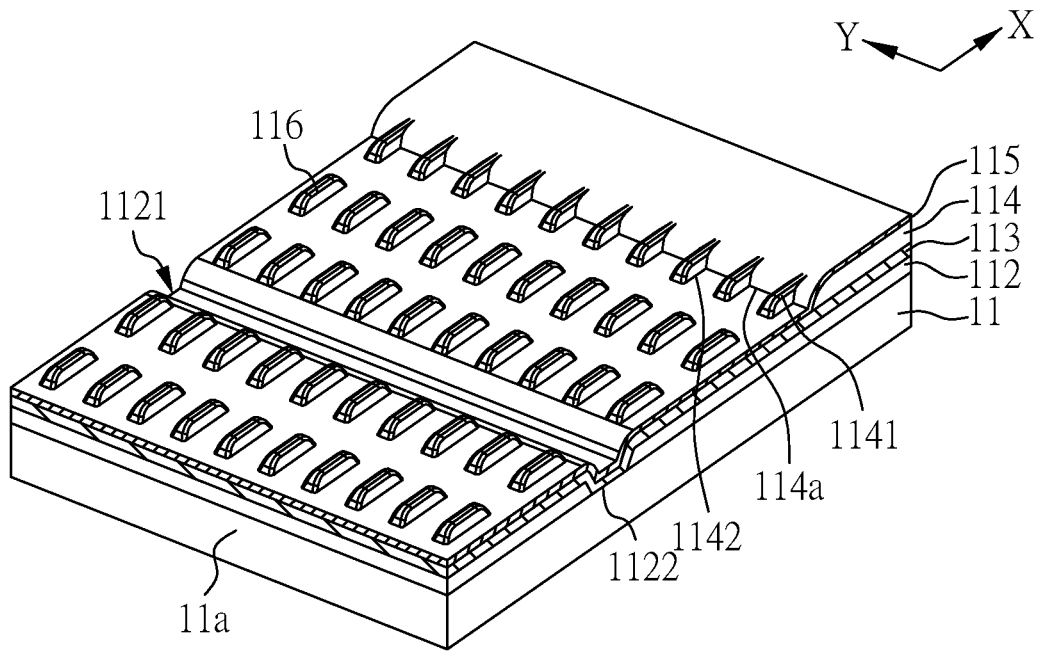
FIG. 11 is a three-dimensional view showing a part of a border region of a display device according to another embodiment of the present disclosure.
Figure 12:
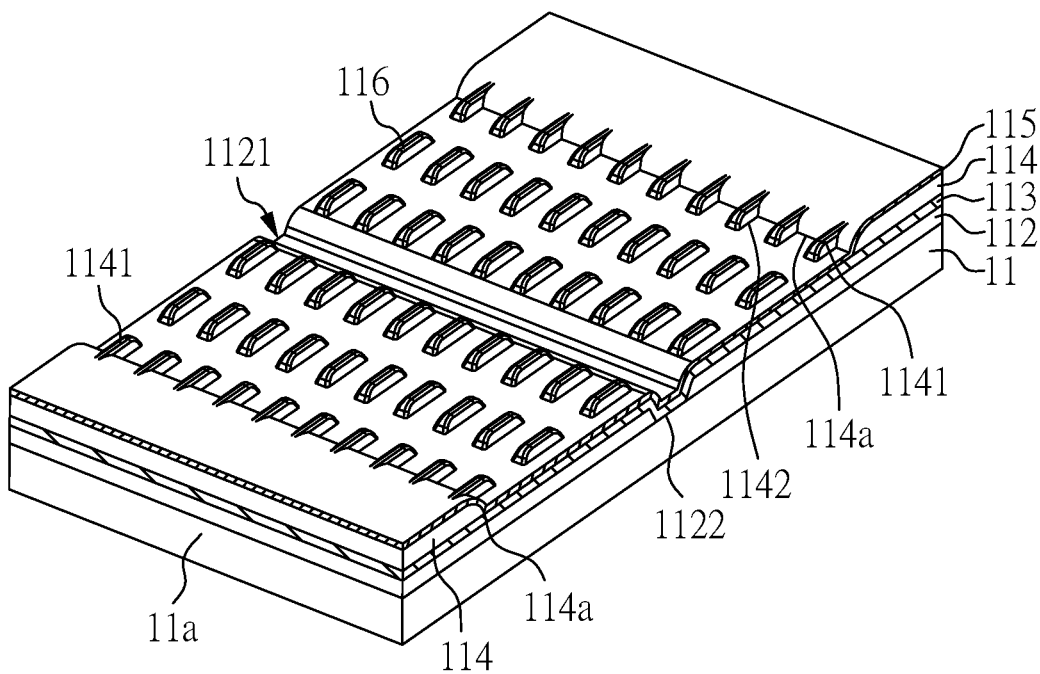
FIG. 12 is a three-dimensional view showing a part of a border region of a display device according to another embodiment of the present disclosure.

As shown in FIG. 1, FIG. 4 and FIG. 5, in the display device of the present embodiment, the protrusions 1141 are protruded toward the display region AA. In another embodiment of the present disclosure shown in FIG. 11, the protrusions 1141 are protruded away from the display region AA, for example, the protrusions 1141 are protruded toward the first edge 11a of the substrate 11. In further another embodiment of the present disclosure shown in FIG. 12, the protrusions 1141 of the second insulating layer 114 can be respectively protruded toward the display region AA and away from the display region AA (for example, protruded toward the first edge 11a of the substrate 11).

In addition, in the display device shown in FIG. 4, FIG. 5, and FIG. 7 to FIG. 12, the protruding directions of the protrusions 1141 are along the second direction X vertical to the first direction Y, but the present disclosure is not limited thereto. The protruding directions of the protrusions 1141 are not limited to the second direction X vertical to the first direction Y.

Furthermore, in the aforesaid embodiment of the present disclosure, as shown in FIG. 1, merely the structure on the border region B adjacent to one side (i.e. the first edge 11a) of the substrate 11 is illustrated. However, the border region adjacent to other sides of the substrate 11 can be also equipped with the aforesaid protrusions, trenches, and bumps. In addition, in the aforesaid embodiment of the present disclosure, although only the first insulating layer, the first electrode layer, the second insulating layer, the protrusions and the bumps on the substrate are shown in the figures, other elements of the display device are also comprised in the scope of the present disclosure.

Figure 13:
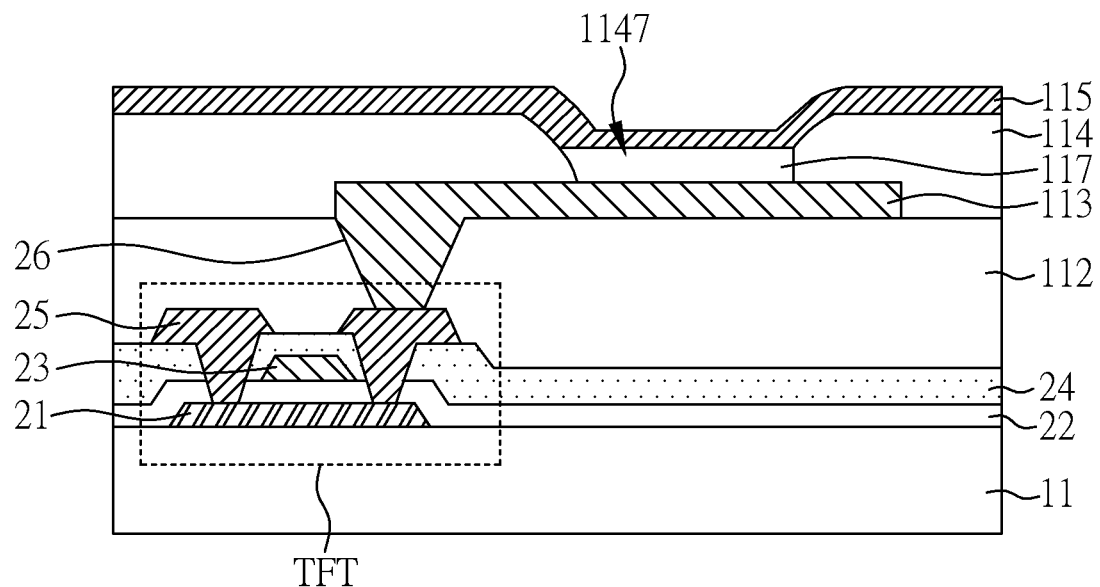
FIG. 13 is a cross-sectional view showing a part of a display region of an OLED display device according to the present disclosure.

FIG. 13 is a cross-sectional view showing a part of a display region of an OLED display device according to the present disclosure. A transistor TFT is disposed on the substrate 11, wherein the transistor TFT comprises: a semiconductor layer 21; a gate insulating layer 22 disposed on the substrate 11 and the semiconductor layer 21; a gate electrode 23 disposed on the gate insulating layer 22 and corresponding to the semiconductor layer 21; a third insulating layer 24 disposed on the gate electrode 23 and on the gate insulating layer 22; and source and drain electrodes 25 disposed on the third insulating layer 24. However, the transistor suitable for the present disclosure is not limited thereto. In addition, the transistor TFT can comprise not only the layers shown in FIG. 13 but also other layers (such as a buffer layer, and other insulating layers) which can improve the adhesion between layers and/or the electrical property of the transistor.

Next, the aforesaid first insulating layer 112, the aforesaid first electrode layer 113 and the aforesaid second insulating layer 114 are sequentially formed on the transistor TFT. Herein, the first electrode layer 113 electrically connects to the source and drain electrodes 25. The second insulating layer 114 has an opening 1147 to expose a part of the first electrode layer 113. Then, an organic material layer 117 is formed in the opening 1147, followed by forming the aforesaid second electrode layer 115 on the organic material layer 117 and the second insulating layer 114. Herein, the organic material layer 117 is the display layer 12 shown in FIG. 2 and FIG. 3, which may comprise a light emitting layer. In addition, the organic material layer 117 may comprise not only the light emitting layer but also other layers such as an electron transporting layer, an electron injection layer, a hole transporting layer, a hole injection layer, and other layers facilitating the combinations of the electrons and the holes.

Figure 14:
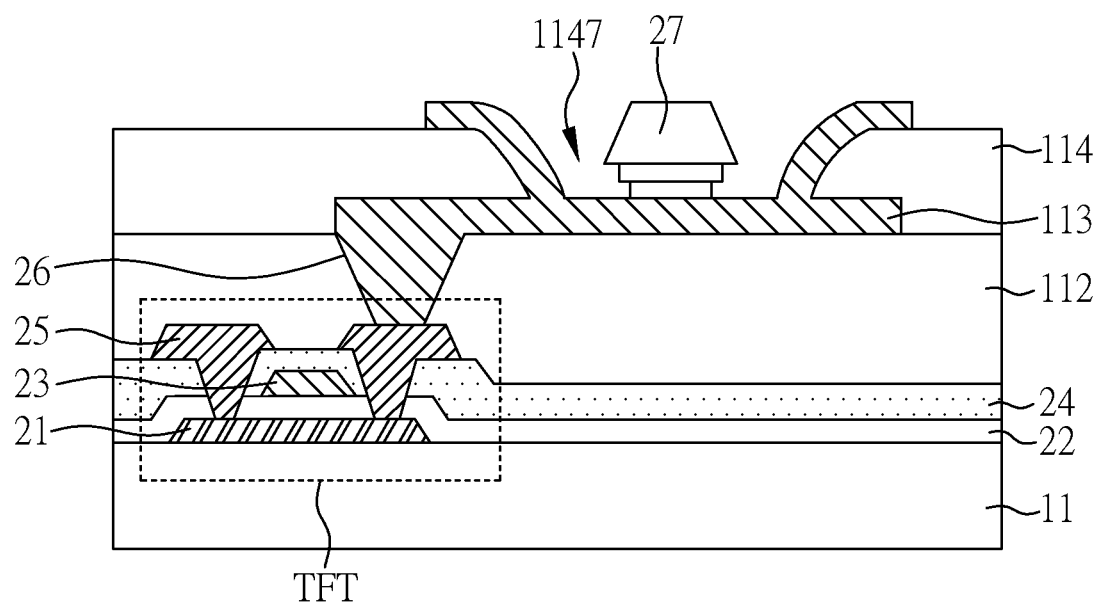
FIG. 14 is a cross-sectional view showing a part of a display region of a micro-LED display device according to the present disclosure.

FIG. 14 is a cross-sectional view showing a part of a display region of a micro-LED display device according to the present disclosure. The structure of the micro-LED display device is similar to the structure shown in FIG. 13, except that the display layer is different. The micro-LED display device shown in FIG. 14 comprises a LED unit 27 disposed on the first electrode layer 113.

In the present disclosure, any one of the display devices obtained in the aforesaid embodiments can be co-used with a touch panel to form a touch display device. For example, as shown in FIG. 2, a touch unit (not shown in the figure) can be disposed on the substrate 11 to obtain an in-cell touch display device; a touch unit (not shown in the figure) can be disposed between the counter substrate 13 and the protection substrate 14 to obtain an on-cell touch display device or an out-cell touch display device. Alternatively, as shown in FIG. 3, a touch unit (not shown in the figure) can be disposed on the substrate 11 to obtain an in-cell touch display device; a touch unit (not shown in the figure) can be disposed between the display layer 12 and the protection substrate 14 to obtain an on-cell touch display device or an out-cell touch display device.

Meanwhile, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a substrate having a first edge, wherein the first edge is parallel to a first direction, and the substrate has a display region and a border region adjacent to the display region;
   a first insulating layer disposed on the substrate;
   a first electrode layer disposed on the first insulating layer;
   a second insulating layer disposed on the first electrode layer, wherein the second insulating layer comprises plural protrusions, the protrusions are disposed in the border region, and the protrusions are arranged along the first direction; and
   a bump disposed in the border region and adjacent to one of the plural protrusions, wherein the first electrode layer comprises a hole overlapping the bump;
   wherein the first insulating layer comprises a trench disposed in the border region.

2. The display device of claim 1, wherein the protrusions are protruded toward the display region.

3. The display device of claim 1, wherein the protrusions are protruded away from the display region.

4. The display device of claim 1, wherein the protrusions are arranged in a comb shape along the first direction.

5. The display device of claim 1, wherein the protrusions comprise curve segments.

6. The display device of claim 5, wherein the second insulating layer further comprises a linear segment disposed between two adjacent curve segments.

7. The display device of claim 1, wherein the trench is extended along the first direction.

8. The display device of claim 1, further comprising a second electrode layer disposed on the second insulating layer, wherein a portion of the second electrode layer overlaps a bottom of the trench.

9. The display device of claim 1, wherein the second insulating layer is not disposed in the trench.

10. The display device of claim 1, wherein the protrusions comprises a first protrusion and a second protrusion, the first protrusion has a first width in the first direction, a gap between the first protrusion and the second protrusion has a second width in the first direction, and the first width is different from the second width.

11. The display device of claim 10, wherein the first width is less than the second width.

12. The display device of claim 1, wherein the bump and the one of the plural protrusions respectively comprise a same material.

13. The display device of claim 12, wherein the bump is disposed on the first insulating layer.

14. The display device of claim 12, wherein the bump is disposed at a protruding direction of the one of the plural protrusions.

15. The display device of claim 1, further comprising plural bumps disposed on the first insulating layer, wherein the bumps are disposed in the border region, and the bumps are arranged in a two dimensional array.

16. The display device of claim 15, wherein the trench is disposed between two adjacent bumps.

17. The display device of claim 15, wherein the trench is disposed between the protrusions and the bumps.

18. The display device of claim 1, wherein a protruding direction of one of the protrusions is a second direction perpendicular to the first direction.

* * * * *